(12) United States Patent
Allen et al.

(10) Patent No.: US 12,445,092 B2
(45) Date of Patent: Oct. 14, 2025

(54) PIEZO-RESISTIVE RESONATOR DEVICE HAVING DRIVE AND SENSE TRANSISTORS WITH WELLS OF OPPOSITE DOPING

(71) Applicant: Intel Corporation, Santa Clara, CA (US)

(72) Inventors: Gary A. Allen, Portland, OR (US); Tanay A. Gosavi, Portland, OR (US); Raseong Kim, Portland, OR (US); Dmitri Evgenievich Nikonov, Beaverton, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 17/530,250

(22) Filed: Nov. 18, 2021

(65) Prior Publication Data

US 2023/0155550 A1    May 18, 2023

(51) Int. Cl.
| | |
|---|---|
| *H03B 5/36* | (2006.01) |
| *H03H 9/17* | (2006.01) |
| *H03H 9/24* | (2006.01) |
| *H03L 7/099* | (2006.01) |
| *H10D 30/62* | (2025.01) |
| *H10D 84/83* | (2025.01) |
| *H10D 84/85* | (2025.01) |

(52) U.S. Cl.
CPC .............. *H03B 5/36* (2013.01); *H03H 9/178* (2013.01); *H03H 9/2426* (2013.01); *H10D 30/62* (2025.01); *H10D 84/834* (2025.01); *H10D 84/853* (2025.01); *H03L 7/099* (2013.01)

(58) Field of Classification Search
CPC ...................... H03B 5/36; H03H 9/178; H03H 2009/02314; H03H 9/2405; H03H 9/2426; H03L 7/099; H10D 30/62; H10D 84/834; H10D 84/853
USPC ................ 331/181, 108 C, 116 M, 154, 158; 257/368, 288, 278; 438/164, 149, 284
See application file for complete search history.

(56) References Cited

U.S. PATENT DOCUMENTS

| | | |
|---|---|---|
| 9,577,060 B2 | 2/2017 | Kim et al. |
| 9,663,346 B1 * | 5/2017 | Bahr ...................... H10D 30/62 |
| 12,057,821 B2 * | 8/2024 | Hager ................... H03H 9/205 |

OTHER PUBLICATIONS

Theory and Design of Phononic Crystals for Unreleased CMOS-MEMS Resonant Body Transistors, Bahr et al ; Published in: Journal of Microelectromechanical Systems ( vol. 24, Issue: 5, Oct. 2015) (Year: 2015).*
Visi4freshers, Mar. 27, 2020 CMOS Basics, Twin tub/well technology https://www.vlsi4freshers.com/2020/03/cmos-fabrication-process.html (Year: 2020).*

* cited by examiner

*Primary Examiner* — Arnold M Kinkead
(74) *Attorney, Agent, or Firm* — Alliance IP, LLC (57) ABSTRACT

In one embodiment, a piezo-resistive resonator device includes one or more drive transistors with source and drain regions in a first well and a sense transistor with source and drain regions in a second well of opposite polarity than the first well. The gates of the drive and sense transistor are connected to a first direct current (DC) source. The drain region of the sense transistor is connected to a second DC source, and the source and drain regions of the drive transistor are connected to an alternating current (AC) source.

25 Claims, 9 Drawing Sheets

PIEZO-RESISTIVE RESONATOR DEVICE HAVING DRIVE AND SENSE TRANSISTORS WITH WELLS OF OPPOSITE DOPING

BACKGROUND

To generate high frequency (e.g., 1-10 GHz) clock signals required in processors (e.g., CPUs, GPUs), cascaded phase lock loop circuits (PLLs) may be used to multiply an external reference clock with a frequency of 25 MHz to 100 MHz. The cascaded PLLs may be a source of a long term jitter (e.g., jitter with a periodicity over tens of cycles of the GHz clock), which can degrade the processor's performance. In addition, due to extra low jitter requirements of certain devices (e.g., wireless RF transceivers or high frequency wireline transceivers), these circuits may also require integrated PLLs that use inductors in their oscillator. However, the integrated inductors do not usually have very high Q factors, take up large silicon areas, cause crosstalk, and have no possibilities for scaling.

DETAILED DESCRIPTION

As described above, certain processor devices may include cascaded PLLs to multiply an external reference clock with a frequency of 25 MHz to 100 MHz to obtain a clock signal on the order of ~1-10 GHz. In some instances, the PLLs may include inductors in their oscillator; however, these inductors do not usually have very high Q factors, take up large silicon areas, cause crosstalk, and have no possibilities for scaling. In embodiments described herein, FET-based resonators (e.g., piezo-resistive resonators (PZRs)) may be used as a low-jitter frequency source for PLL circuits.

A PZR device according to the present disclosure may include a resonant circuit in which drive transistor(s) are mechanically coupled to sense transistor(s) by a shared gate. An RF frequency signal on the drive transistor causes an oscillating mechanical stress across the drive transistor's gate dielectric due to capacitive actuation. At certain drive frequencies, there is a mechanical resonance where the frequency is determined by the gate pitch (which may refer to the distance between two adjacent gates/fins, e.g., in a multiple transistor device as described herein) and material properties of the gate material. The mechanical resonance propagates down the length of the shared gate where it causes a piezo-resistive effect on the channel of the sense transistor. The resonance can then be detected at the sense transistor where the oscillating stress modulates the channel mobility and therefore the channel current.

To avoid the potential of the drive signal "feeding through" the substrate and appearing at the sense transistor, embodiments herein may implement the drive and sense transistors in wells of opposite doping, reducing the feedthrough of the drive signal into the sense transistor(s) (via the pn junction that is formed between the two oppositely-doped wells). Conduction may accordingly be reduced, e.g., due to the higher resistance of the junction compared to the resistance of the substrate. In addition, in certain embodiments, the drive transistor may operate in the accumulation mode, which can accommodate higher operating frequencies for the resonator device.

Figure 1A:
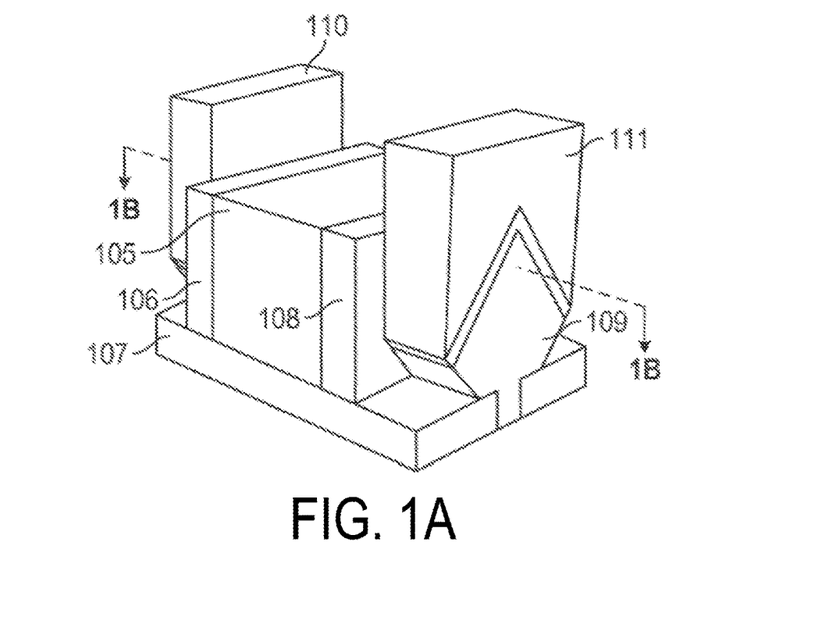
FIGS. 1A-1B illustrate aspects of an example piezo-resistive resonator (PZR) device in accordance with embodiments of the present disclosure.
Figure 1B:
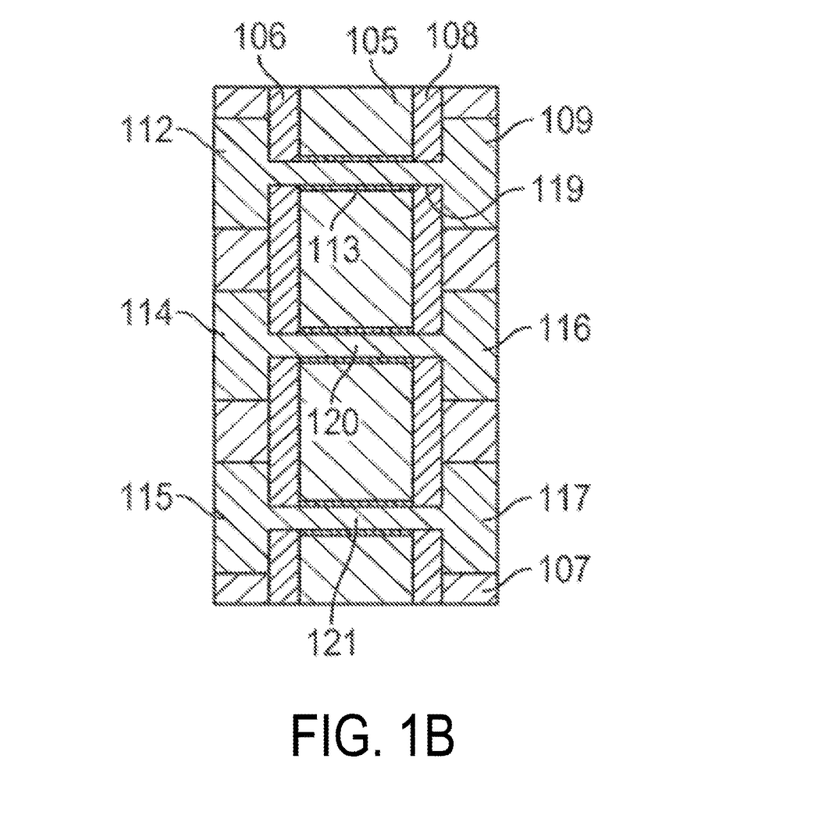

FIGS. 1A-1B illustrate aspects of an example piezo-resistive resonator (PZR) device in accordance with embodiments of the present disclosure. In particular, FIG. 1A illustrates a tri-gate transistor with a source or drain node 109 coupled to a channel of a fin, which then couples to a corresponding drain or source node. Source and drain nodes are connected to contacts 110, 111. Spacers 106, 108 are located between the gate 105 and the source/drain nodes, which are on top of substrate 107. More particularly, the transistor of FIG. 1A is a fin-based field-effect transistor (FinFET) formed around a thin strip of semiconductor material (referred to as the "fin"). The fin is formed on layer 107. Layer 107 may be a substrate, oxide, and the like. In some embodiments, the fin may be formed from the substrate. The FinFET includes MOSFET nodes: gate 105, gate dielectric 113 (see FIG. 1B), and source and drain regions. The source and drain regions may be highly doped (with epitaxial growth in some embodiments). A conductive channel of the FinFET resides on the outer sides of the fin beneath the gate dielectric. Current runs along both "sidewalls" of the fin as well as along the top side of the fin. Because the conductive channel essentially resides along the three different outer, planar regions of the fin, the particular FinFET of FIG. 1A is typically referred to as a "tri-gate" FinFET. Other types of FinFETs exist (such as "double-gate" FinFETs, which may be included in other embodiments and in which the conductive channel principally resides only along both sidewalls of the fin and not along the top side of the fin).

FIG. 1B includes a series of tri-gate FinFETs similar to the FinFET of FIG. 1A that collectively form a resonator device. Specifically, FIG. 1B shows a cross-sectional view of a multi-fin structure on the x-y plane with z at the fin center. FIG. 1B includes a tri-gate transistor with a drain node 109 coupled to a channel 119 of a fin, which then couples to a corresponding source node 112. Channel 119 couples to gate dielectric 113 and gate 105. Other transistors include drain nodes 116, 117, channels 120, 121 (all of which couple to gate 105 via separate gate dielectric portions), and source nodes 114, 115. Although FIG. 1B includes three transistors, other embodiments may include additional or fewer transistors, e.g., as described below.

Figure 2A:
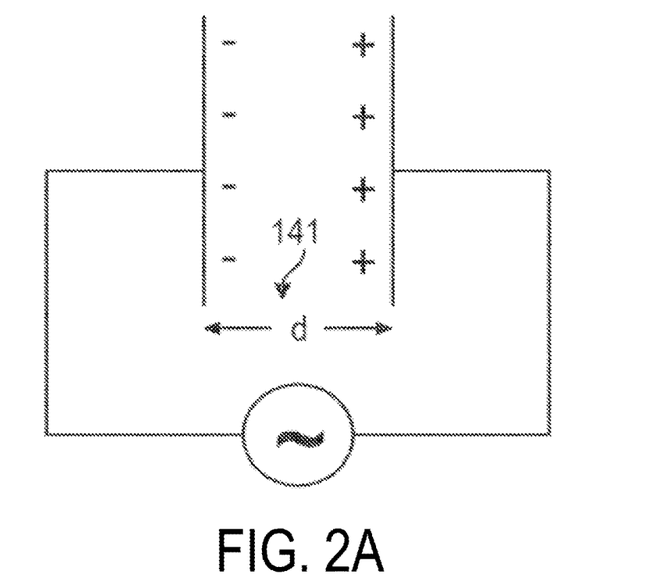
FIGS. 2A-2D illustrate example operational aspects of a PZR in accordance with embodiments of the present disclosure.

FIGS. 2A-2D illustrate example operational aspects of a PZR in accordance with embodiments of the present disclosure. In particular, FIG. 2A depicts a parallel plate capacitor model for modeling resonator actuation in embodiments of the present disclosure. The driving schemes for a PZR (modeled by the capacitor of FIG. 2A) include:

$$F_{ac} = \frac{\epsilon A}{d^2} V_{DC} v_{in}$$

where d, $\epsilon$, A, $V_{DC}$, and $v_{in}$ respectively correspond to gap thickness, permittivity, capacitor area, DC bias, and AC bias, and result in actuation 141 due to actuation force $F_{ac}$.

Figure 2B:
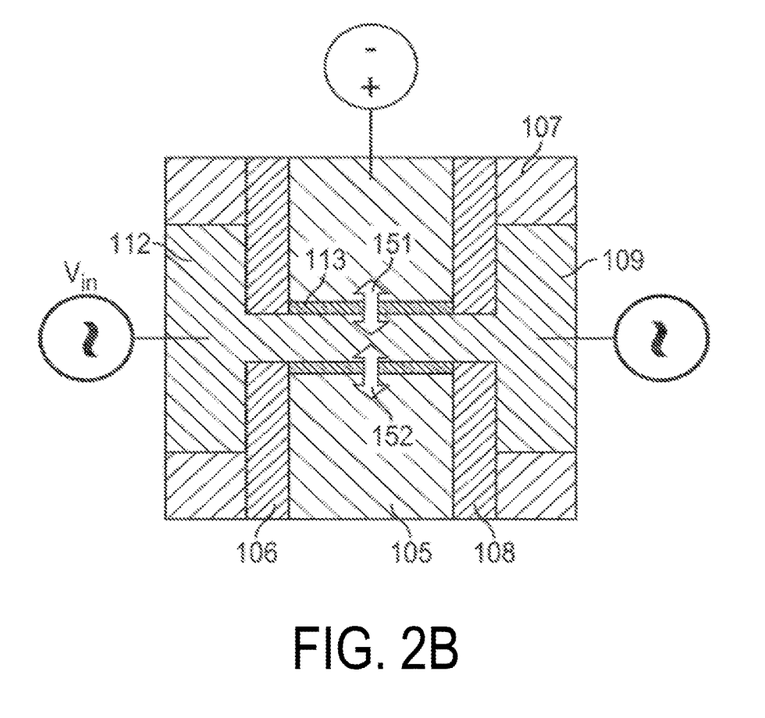

FIG. 2B depicts capacitive actuation 151, 152 in embodiments of the present disclosure. A voltage $V_{DD}$ may be supplied to gate 105 and an AC voltage may be input at source 112/drain 109 to induce capacitive actuation 151, 152 across the gate dielectric 113. The high-k dielectric 113 helps provide a larger $F_{ac}$ for the same bias inputs. The $V_{DD}$ DC input is used to create capacitance across the fin and the dielectric 113.

Figure 2C:
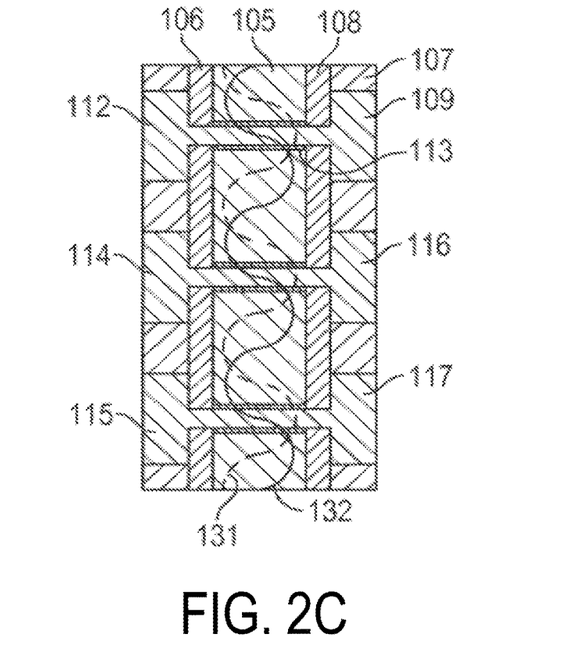

FIG. 2C depicts mechanical resonance within the gate 105 of a multi tri-gate resonator in embodiments of the present disclosure. As a result of the actuation shown in FIG. 2B, mechanical resonance occurs within the gate 105. In the example shown, line 132 corresponds to longitudinal displacement of the gate 105 and line 131 corresponds to dynamic stress within the gate 105.

Figure 2D:
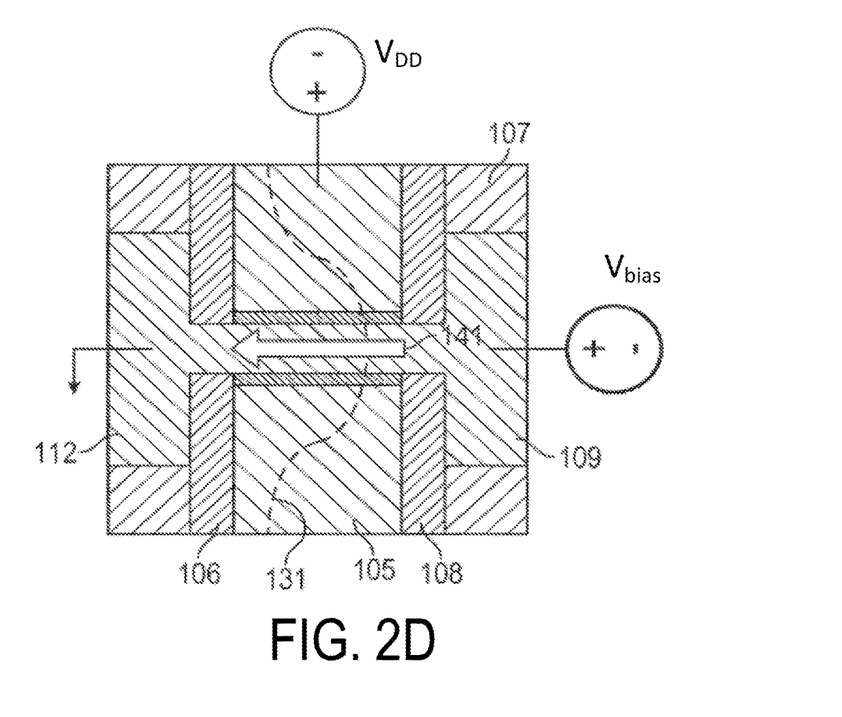

FIG. 2D depicts piezoresistive sensing in a PZR in embodiments of the present disclosure. To sense the periodic stress 131, the gate 105 is biased with $V_{DD}$ (which may help provide capacitance and generate an inversion layer for the channels that couple sources/drains to one another) and a DC bias ($V_{bias}$) is applied to the drain 109 to flow current 141 through the fin. When the gate 105 resonates, the DC current 141 is piezoresistively modulated by the dynamic tensile/compressive stress 131 within the fin.

Figure 3A:
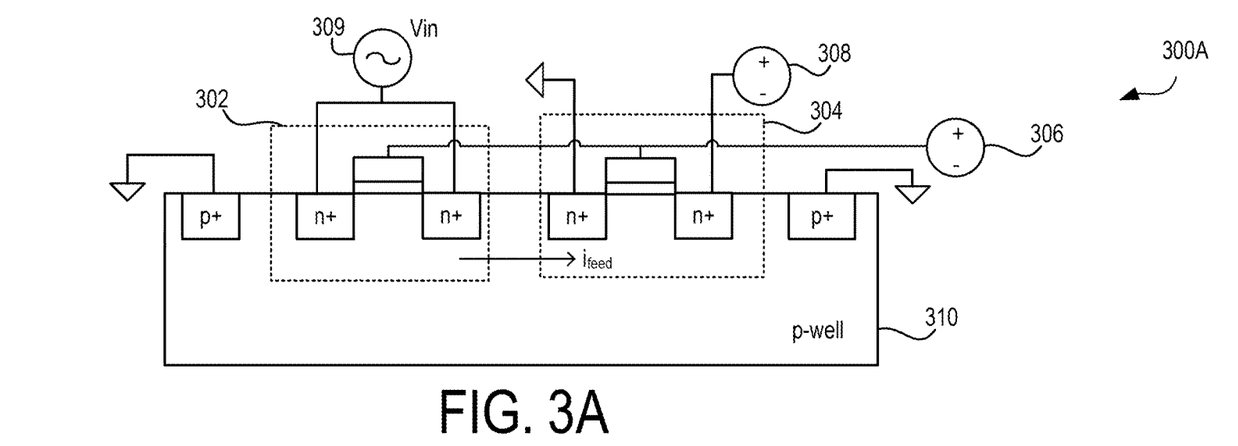
FIGS. 3A-3B illustrate example transistor configurations for a PZR device in accordance with embodiments of the present disclosure.
Figure 3B:
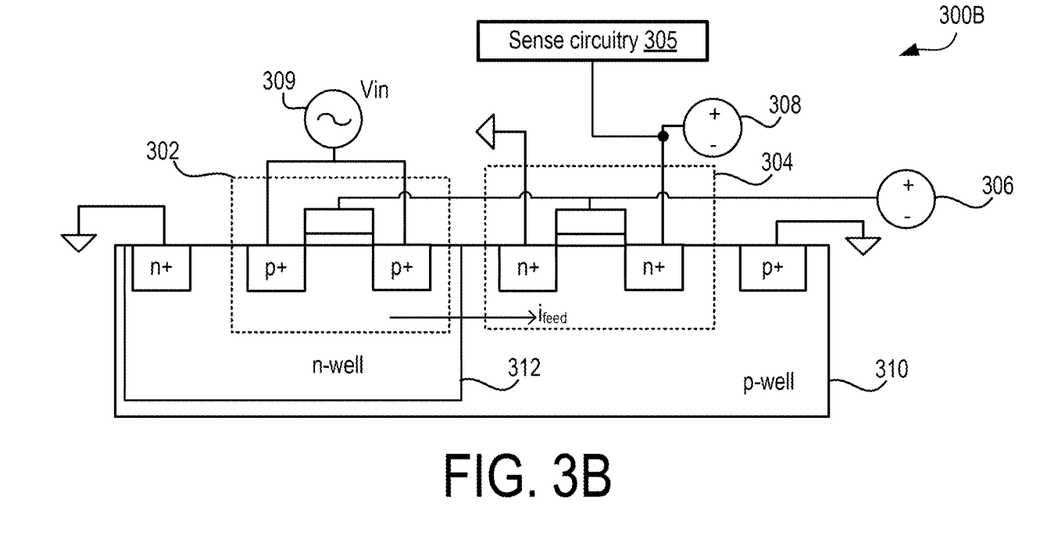

FIGS. 3A-3B illustrate example transistor configurations for a PZR device in accordance with embodiments of the present disclosure. In particular, FIG. 3A illustrates an example PZR device configuration 300A with a drive transistor 302 and a sense transistor 304 that share the same well. In the example shown, the drive transistor 302 and sense transistor 304 are npn transistors located in the same p-well of the substrate 310 (e.g., where the substrate 310 is lightly doped). Because both the transistors 302, 304 share the same well, the current from the drive signal ($V_{in}$) can reach the sense transistor 304 through the substrate, bypassing the desired coupling through the shared gates of the devices, and causing feed-through current ($i_{feed}$) from the drive transistor 302 to the sense transistor 304. This feed-through current can increase the background signal level at the resonance frequency, degrading the true mechanical resonance signal. The amount of feed-through current may be determined by the junction capacitance ($C_j$) and junction resistance ($R_j$) of n+/p-well junction and the substrate resistance ($R_{sub}$). It is noted that the drive transistor 302 operates in the inversion mode; thus, at high frequencies (e.g., 10's of GHz or more), the inversion carriers may not respond fast enough, which may limit the operating frequency of the resonator device.

FIG. 3B illustrates an example PZR device configuration 300B where the drive transistor 302 and sense transistor 304 are in different wells of opposite polarity. In the example shown, the sense transistor 304 is a npn transistor in the p-well of the substrate 310, just as in FIG. 3A. However, the drive transistor 302 is a pnp transistor in a separate n-well 312 of the substrate 310. In this configuration, the feed-through current ($i_{feed}$) from drive to sense must now go through the junction between the n-well 312 and the pwell of the substrate 310. Because of this, the feed-through current may be limited by the junction capacitance ($C_{J,sub}$) and the junction resistance ($R_{J,sub}$) between the wells. Since the junction resistance is usually much larger than the substrate resistance ($R_{sub}$), the feed-through current from the drive transistor 302 to the sense transistor 304 will be reduced. It is noted that the drive transistor 302 operates in the accumulation mode, and accumulation carriers may respond faster to the input frequency compared with inversion carriers. Accordingly, the configuration 300B may be able to support higher frequencies than the configuration 300A of FIG. 3A.

In each of the examples shown, there is a DC voltage source 306 coupled to the gates of both the drive transistor 302 and sense transistor 304. In addition, there is a DC voltage source 308 coupled to the drain region of the sense transistor 304, while the source region of the sense transistor 304 is coupled to ground. Further, there is an AC voltage source 309 (e.g., an RF signal source) coupled to the source and drain regions of the drive transistor 302. The AC signal generated by the AC voltage source may induce a mechanical resonance within the apparatus as described above, and the resonance may cause a modulation of the DC current flowing in the sense transistor 304 (e.g., flowing from the drain region) based on the voltage applied by the DC voltage source 308. The example configuration shown in FIG. 3B also includes sense circuitry 305 coupled to the sense transistor 304 (e.g., to the drain region of the sense transistor 304). The sense circuitry 305 may detect the modulation in the current through the sense transistor 304 caused by the AC input signal applied to the drive transistor. Although not shown, sense circuitry similar to the sense circuitry 305 may be implemented in a similar manner in the example configuration 300A of FIG. 3A.

As used herein, a DC contact may refer to a contact that is to be connected to a DC voltage source, such as 308, and an AC contact may refer to a contact that is to connect to an AC voltage source, such as 309. In certain embodiments, a DC contact may be shielded by other metal lines connected to a ground to provide DC signal stability (i.e., large capacitance). AC contacts, however, may be moved away and separated from other signals in the device as much as possible (e.g., through signal routing on separate metal layers) to reduce feed-through (providing a small capacitance). To further reduce the capacitance around the AC signal line, ground metal lines nearby or even floating metal strips (e.g., metal fillers) may be further removed from the areas around the AC contacts.

Figure 4A:
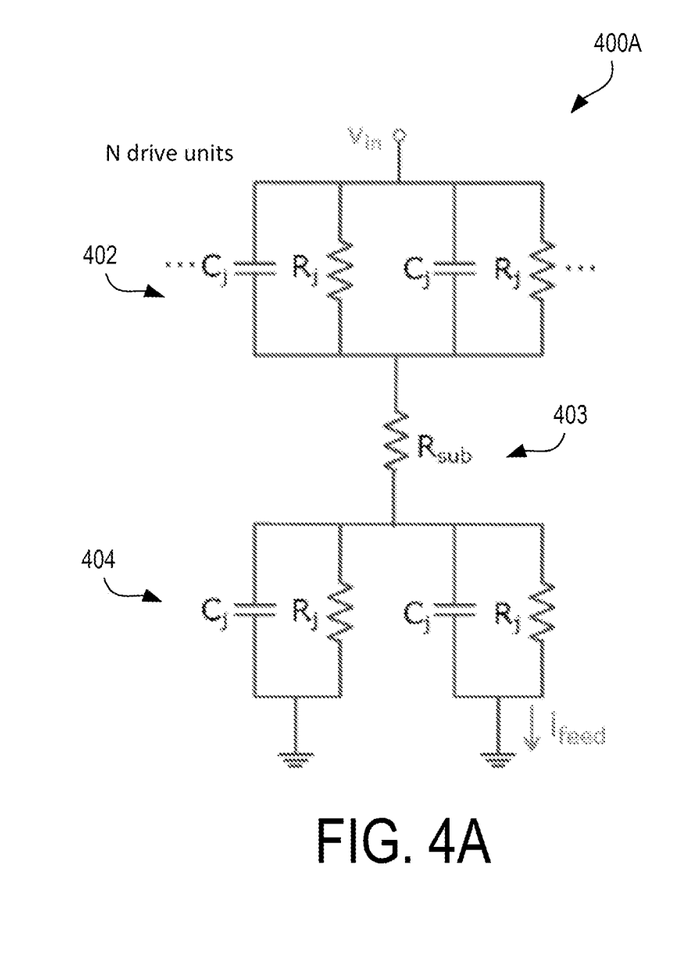
FIGS. 4A-4B illustrate example circuit modeling for the transistor configurations of FIGS. 3A-3B, respectively.
Figure 4B:
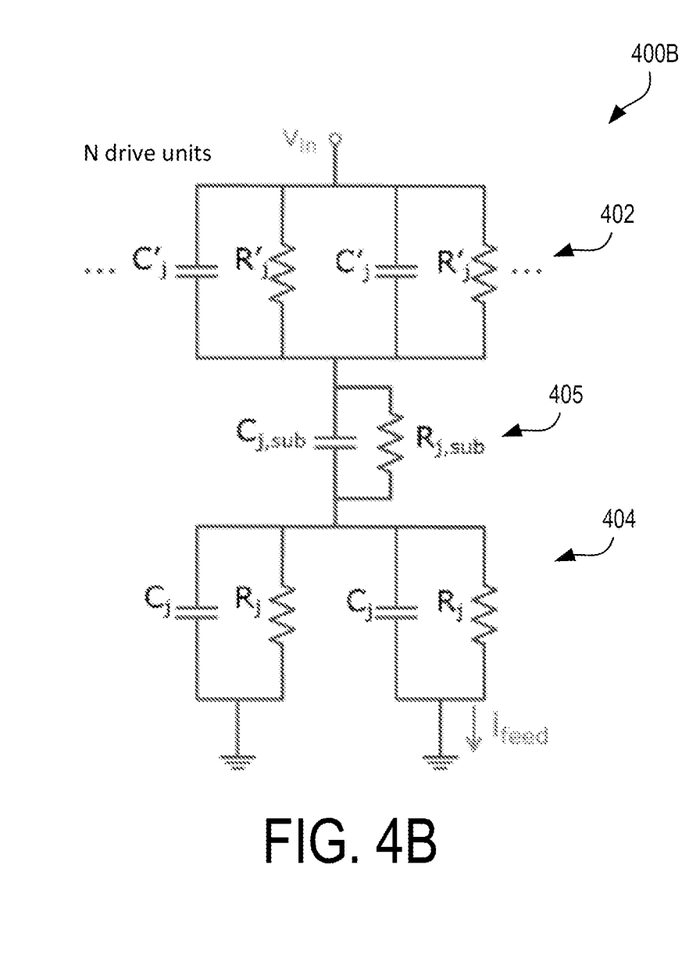

FIGS. 4A-4B illustrate example circuit modeling for the transistor configurations of FIGS. 3A-3B, respectively. As shown, each drive unit 402 can be modeled by two capacitors ($C_j$, which represents the capacitance of the junction between the source/drain of the drive transistor 302 of FIG. 3A and the substrate 310, or $C_j'$, which represents the capacitance of the junction between the source/drain of the drive transistor 302 of FIG. 3B and the well 312) in parallel with two resistors ($R_j$, which represents the resistance of the junction between the source/drain of the drive transistor 302 of FIG. 3A and the substrate 310, or $R_j'$, which represents the resistance of the junction between the source/drain of the drive transistor 302 of FIG. 3B and the well 312), and each sense unit 404 can similarly be modeled by two capacitors ($C_j$, which represents the capacitance of the junction between the source/drain of the sense transistor 304 of FIGS. 3A-3B and the substrate 310) in parallel with two resistors ($R_j$, which represents the resistance of the junction between the source/drain of the sense transistor 304 of FIGS. 3A-3B and the substrate 310).

In the configuration of FIG. 3A, the resistance of the substrate 403 is modeled as $R_{sub}$, as shown in FIG. 4A. In configuration of FIG. 3B, the junction between the wells 405 is modeled as follows: the resistance of the substrate and junction between the well of the substrate 310 and the well 312 is modeled as $R_{j,sub}$, and the capacitance of the junction between the well of the substrate 310 and the well 312 is modeled as $C_{j,sub}$ as shown in FIG. 4B. The behavior of the example RC circuit models shown may then be described as follows. The RC circuit diagram of FIG. 4A may be modeled as:

$$\frac{i_{feed}}{v_{in}} = \frac{1}{2} * \frac{1}{\left(\frac{1}{\frac{2N}{R_j} + j\omega 2NC_j} + R_{sub} + \frac{1}{\frac{2}{R_j} + j\omega 2C_j}\right)}$$

and the RC circuit diagram of FIG. 4B may be modeled as:

$$\frac{i_{feed}}{v_{in}} = \frac{1}{2} * \frac{1}{\left(\frac{1}{\frac{2N}{R_j} + j\omega 2NC'_j} + \frac{1}{\frac{1}{R_{j,sub}} + j\omega C_{j,sub}} + \frac{1}{\frac{2}{R_j} + j\omega 2C_j}\right)}$$

where N refers to the number of drive units in the PZR device (for embodiments with multiple drive units to each sense unit, e.g., as described below), and $\omega=2\pi f$ with f being the frequency. It will be seen from the above equations that the feed-through reduction of the configuration of FIG. 3B becomes more effective when $R_j$ is small, $C_j$ is large, and $R_{sub}$ is small.

Although the examples shown in FIGS. 3A-3B include planar transistors, other embodiments may implement different types of transistors, such as FinFET transistors (e.g., as shown in FIGS. 1A-1B) or GAA transistors. In addition, in some embodiments, the drive transistor may be implemented as a metal-oxide semiconductor capacitor (MOSCAP). Moreover, in some embodiments, there may be multiple drive transistors/MOSCAPs within the same well (e.g., multiple drive transistors within the well 312).

Further, though the examples include one drive transistor 302 and one sense transistor 304, other embodiments may include any suitable number of drive or sense transistors. For example, as described further below, a configuration may include a N:1 drive:sense transistor ratio, where N>1. In particular, N:1 drive:sense ratio configurations, e.g., on the order of 10:1, may be quite beneficial, as shown below.

Figure 5A:
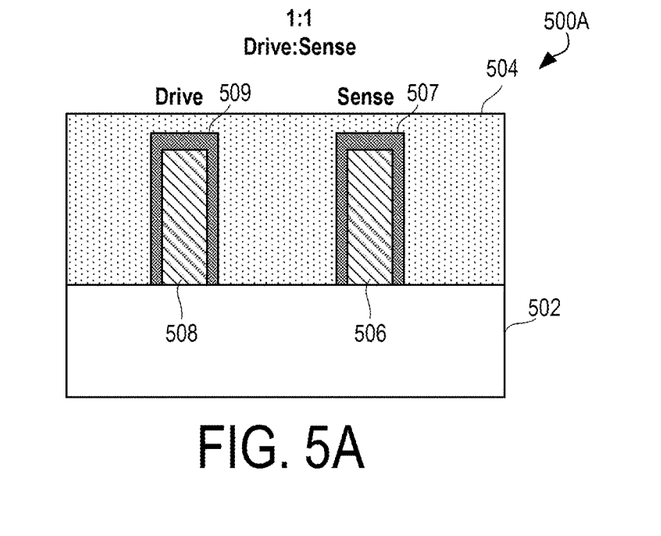
FIGS. 5A-5C illustrate example PZR devices with different drive:sense ratios in accordance with embodiments of the present disclosure.
Figure 5B:
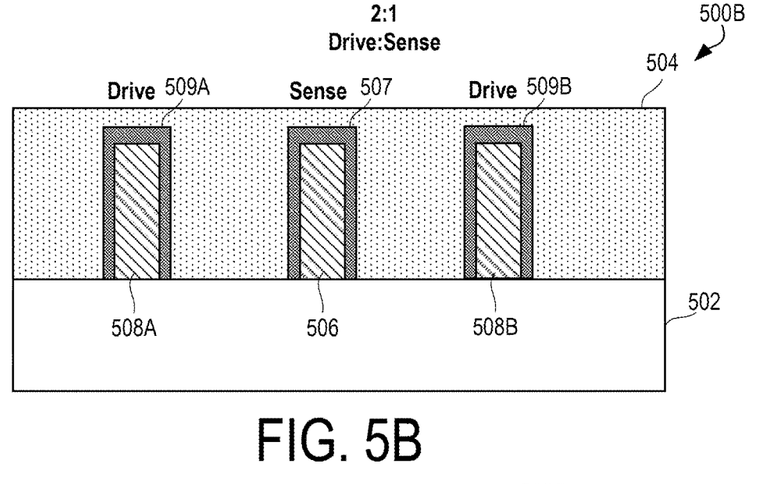
Figure 5C:
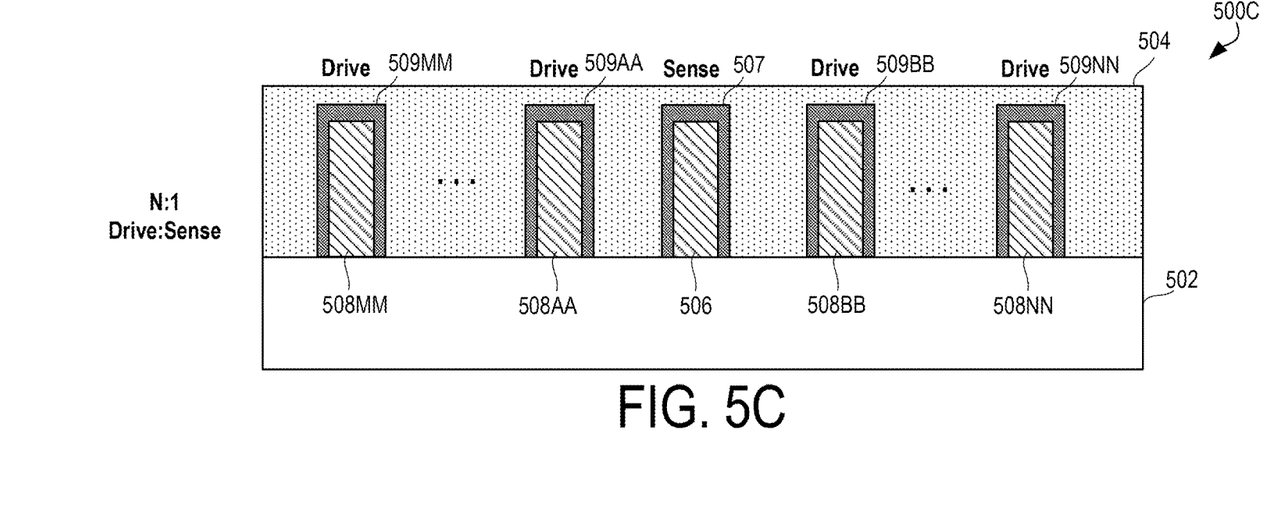

FIGS. 5A-5C illustrate example PZR devices 500 with different drive:sense ratios in accordance with embodiments of the present disclosure. In particular, FIGS. 5A-5C illustrate side cross-sectional views of FinFET-based PZR devices 500. In each embodiment, there is a sense transistor fin and one or more drive transistor fins on a common substrate 502, and sharing a common gate 504. Each sense transistor fin includes a channel 506 surrounded by a dielectric 507 (which is between the channel 506 and the gate 504), and each drive transistor fin includes a channel 508 surrounded by a dielectric 509 (which is between the channel 508 and the gate 504). The example PZR device 500A shown in FIG. 5A has a drive:sense ratio of 1, while the example PZR device 500B shown in FIG. 5B has a drive:sense ratio of 2 and the example PZR device 500C shown in FIG. 5C has a drive:sense ratio of N.

Figure 6A:
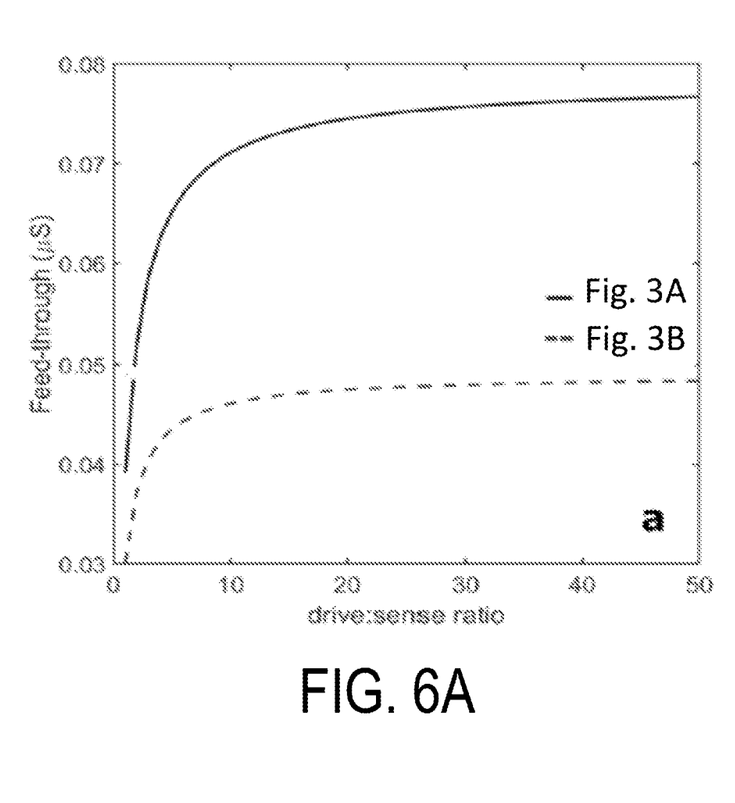
FIGS. 6A-6B illustrate example simulation data for the transistor configurations shown in FIGS. 3A-3B.
Figure 6B:
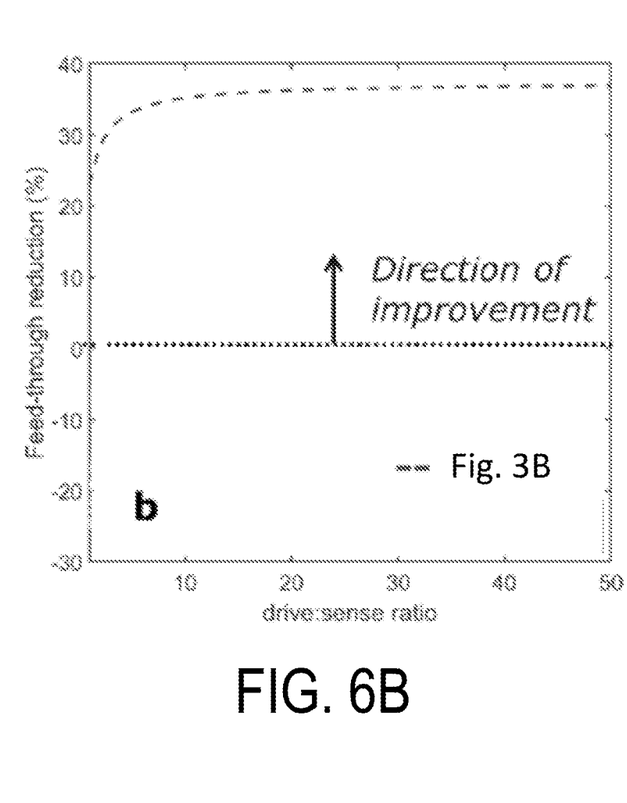

FIGS. 6A-6B illustrate example simulation data for the transistor configurations shown in FIGS. 3A-3B. In particular, FIGS. 6A-6B illustrate an example numerical simulation of the amount of feed-through as a function of the drive:sense ratios for the configurations of FIGS. 3A-3B. The simulation data shown is based on the use of tri-gate transistors for a resonant frequency of 10 GHz. As shown in FIG. 6B, the percentage decrease in the feed-through of having drive and sense transistors in oppositely-doped wells (e.g., as shown in FIG. 3B) may improve (decrease) the feed-through by more than 20% when compared with the same configuration, but with drive and sense transistors in the same well (e.g., as shown in FIG. 3A).

Figure 7:
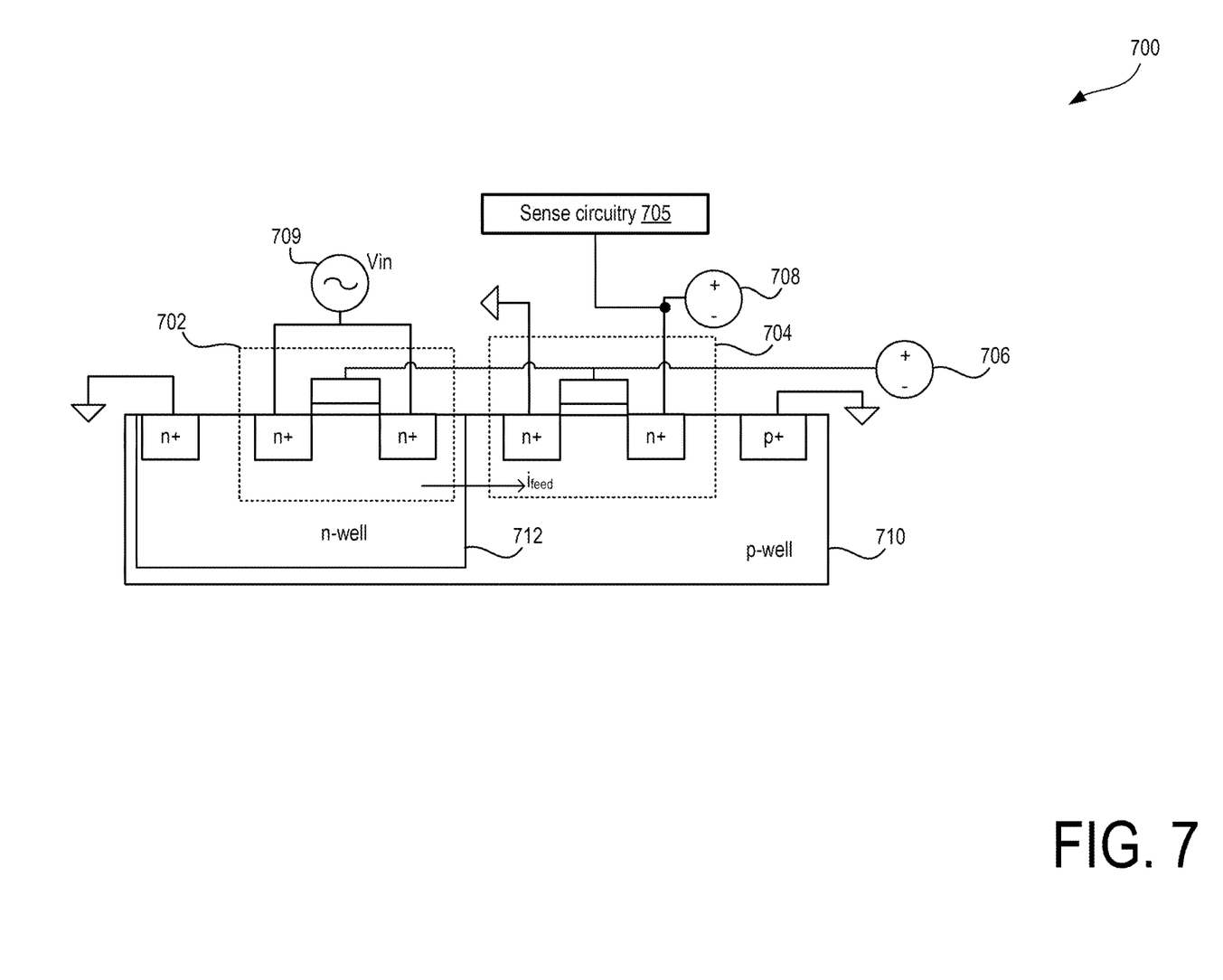
FIG. 7 illustrates an example PZR device with a varactor as a drive circuit in accordance with embodiments of the present disclosure.

FIG. 7 illustrates an example PZR device 700 with a varactor as a drive circuit in accordance with embodiments of the present disclosure. In particular, the example PZR device 700 includes a drive MOSCAP varactor circuit 702 coupled with a sense transistor 704, where the drive circuit 702 is in a well of opposite polarity than that of the sense transistor 704. The drive circuit 702 may enable even higher operating frequencies, as accumulation charge (electrons in this embodiment) may be more effectively supplied by highly-doped contacts. The other elements of the example PZR device 700 are implemented in the same manner as the configuration shown in FIG. 3B. Like that configuration, because of the pn junction in the substrate, the PZR device 700 may provide reduced feed-through in a similar manner as described above.

Figure 8:
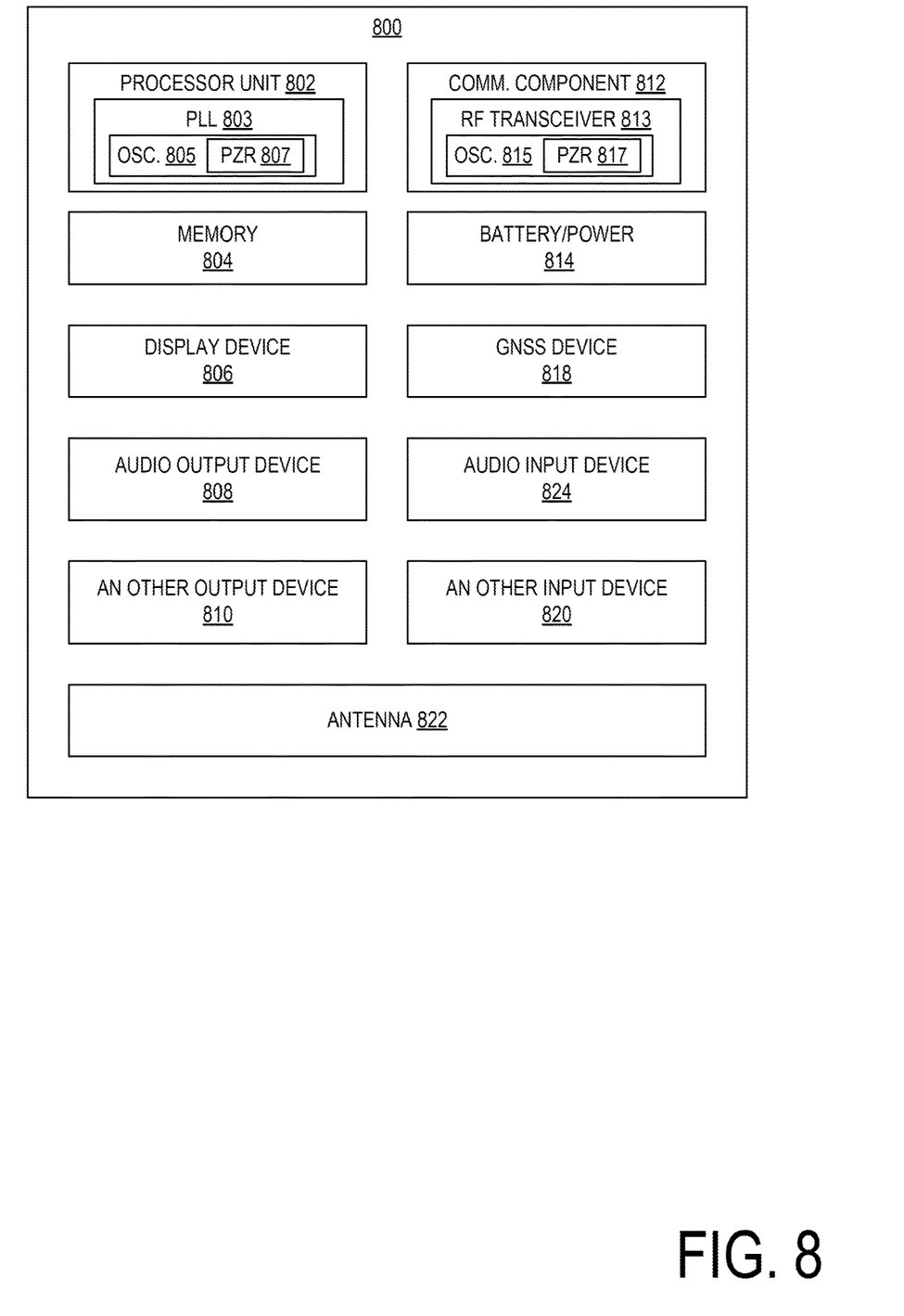
FIG. 8 is a block diagram of an example electrical device that may include a microelectronic assembly, in accordance with any of the embodiments disclosed herein.

FIG. 8 is a block diagram of an example electrical device 800 that may include one or more of the PZR devices disclosed herein. For example, PZR devices of the present disclosure may be utilized in any suitable resonator implementation. For example, the PZR devices of the present disclosure may be implemented in an oscillator of a PLL that is used for clocking purposes (e.g., as PZR device 807 in the oscillator 805 of PLL 803 of processor unit 802 of FIG. 8), as part of an oscillator of a radio frequency (RF) transceiver (e.g., as PZR device 817 in oscillator 815 of the RF transceiver 813 of communication component 812 of FIG. 8), for instance, as part of a local oscillator for heterodyning RF signals or as part of a filter circuit.

A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards mainboards, or system boards. In some embodiments, one or more of these components are fabricated onto a single system-on-a-chip (SoC) die.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include one or more processor units 802. As used herein, the terms "processor unit", "processing unit" or "processor" may refer to any device or portion of a device that processes electronic data from registers and/or memory to transform that electronic data into other electronic data that may be stored in registers and/or memory. The processor unit 802 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 800 may include a memory 804, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 804 may include memory that is located on the same integrated circuit die as the processor unit 802. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 800 can comprise one or more processor units 802 that are heterogeneous or asymmetric to another processor unit 802 in the electrical device 800. There can be a variety of differences between the processing units 802 in a system in terms of a spectrum of metrics of merit including architectural, microarchitectural, thermal, power consumption characteristics, and the like. These differences can effectively manifest themselves as asymmetry and heterogeneity among the processor units 802 in the electrical device 800.

In some embodiments, the electrical device 800 may include a communication component 812 (e.g., one or more communication components). For example, the communication component 812 can manage wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication component 812 may manage wired communications, such as electrical, optical, or any other suitable communication protocols (e.g., IEEE 802.3 Ethernet standards). As noted above, the communication component 812 may include multiple communication components. For instance, a first communication component 812 may be dedicated to shorter-range wireless communications such as Wi-Fi or Bluetooth, and a second communication component 812 may be dedicated to longer-range wireless communications such as global positioning system (GPS), EDGE, GPRS, CDMA, WiMAX, LTE, EV-DO, or others. In some embodiments, a first communication component 812 may be dedicated to wireless communications, and a second communication component 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any embedded or wired or wirelessly connected external device that generates an audible indicator, such speakers, headsets, or earbuds.

The electrical device 800 may include an audio input device 824 (or corresponding interface circuitry, as discussed above). The audio input device 824 may include any embedded or wired or wirelessly connected device that generates a signal representative of a sound, such as microphones, microphone arrays, or digital instruments (e.g., instruments having a musical instrument digital interface (MIDI) output). The electrical device 800 may include a Global Navigation Satellite System (GNSS) device 818 (or corresponding interface circuitry, as discussed above), such as a Global Positioning System (GPS) device. The GNSS device 818 may be in communication with a satellite-based system and may determine a geolocation of the electrical device 800 based on information received from one or more GNSS satellites, as known in the art.

The electrical device 800 may include an other output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include an other input device 820 (or corresponding interface circuitry, as discussed above). Examples of the other input device 820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 800 may be any other electronic device that processes data. In some embodiments, the electrical device 800 may comprise multiple discrete physical components. Given the range of devices that the electrical device 800 can be manifested as in various embodiments, in some embodiments, the electrical device 800 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Further, as used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

Example 1 includes an apparatus comprising: a first transistor comprising a source region, a drain region, a channel region between the source and drain regions, a gate contact, and a dielectric between the gate contact and the channel region, wherein the source and drain regions of the first transistor are doped regions in a first well; a second transistor comprising a source region, a drain region, a channel region between the source and drain regions, a gate contact, and a dielectric between the gate contact and the channel region, wherein the source and drain regions of the second transistor are doped regions in a second well of opposite polarity than the first well; a first direct current (DC) contact to receive DC current, the first DC contact coupled to the gate contact of the first transistor and to the gate contact of the second transistor; a second direct current (DC) contact to receive DC current, the second DC contact coupled to the drain region of the second transistor; and alternating current (AC) contacts to receive AC current, the AC contacts coupled to the source and drain regions of the first transistor.

Example 2 includes the subject matter of Example 1, wherein the source and drain regions of the first transistor are of a different polarity than the first well.

Example 3 includes the subject matter of Example 1, wherein the source and drain regions of the first transistor are of the same polarity as the first well.

Example 4 includes the subject matter of any one of Examples 1-3, wherein the first and second transistor are planar transistors.

Example 5 includes the subject matter of any one of Examples 1-3, wherein the first and second transistor are fin-based field-effect transistors (FinFETs).

Example 6 includes the subject matter of any one of Examples 1-5, wherein the second well is a doped substrate, and the first well is a doped region within the substrate.

Example 7 includes the subject matter of any one of Examples 1-6, further comprising a third transistor comprising a source region, a drain region, a channel region between the source and drain regions, a gate contact, and a dielectric between the gate contact and the channel region, wherein the source and drain regions of the third transistor are doped regions in a third well of the same polarity as the first well, and the AC contacts are coupled to the source and drain regions of the third transistor.

Example 8 includes the subject matter of Example 7, wherein the second transistor is between the first and third transistors.

Example 9 includes the subject matter of any one of Examples 1-8, further comprising: a first DC voltage source coupled to the first DC contact; a second DC voltage source coupled to the second DC contact; and an AC voltage source coupled to the AC contacts.

Example 10 includes a resonator device comprising: a first transistor comprising a source region, a drain region, a channel region between the source and drain regions, a gate contact, and a dielectric between the gate contact and the channel region, wherein the source and drain regions of the first transistor are doped regions in a first well; a second transistor comprising a source region, a drain region, a channel region between the source and drain regions, a gate contact, and a dielectric between the gate contact and the channel region, wherein the source and drain regions of the second transistor are doped regions in a second well of opposite polarity than the first well; a direct current (DC) source coupled to the gate contact of the first transistor and to the gate contact of the second transistor; an alternating current (AC) source coupled to the source and drain regions of the first transistor; sense circuitry coupled to the second transistor to detect modulation of a current flowing through the second transistor based on an input signal from the AC source.

Example 11 includes the subject matter of Example 10, wherein the source and drain regions of the first transistor are of a different polarity than the first well.

Example 12 includes the subject matter of Example 10, wherein the source and drain regions of the first transistor are of the same polarity as the first well.

Example 13 includes the subject matter of any one of Examples 10-12, wherein the first and second transistor are planar transistors.

Example 14 includes the subject matter of any one of Examples 10-12, wherein the first and second transistor are fin-based field-effect transistors (FinFETs).

Example 15 includes the subject matter of any one of Examples 10-14, wherein the second well is a doped substrate, and the first well is a doped region within the substrate.

Example 16 includes the subject matter of any one of Examples 10-15, further comprising a third transistor comprising a source region, a drain region, a channel region between the source and drain regions, a gate contact, and a dielectric between the gate contact and the channel region, wherein the source and drain regions of the third transistor are doped regions in a third well of the same polarity as the first well, and the AC contacts are coupled to the source and drain regions of the third transistor.

Example 17 includes the subject matter of Example 16, wherein the second transistor is between the first and third transistors.

Example 18 includes a system comprising: an oscillator comprising a piezoresistive resonator (PZR) apparatus, the PZR apparatus comprising: a sense transistor comprising a source region, a drain region, a channel region between the source and drain regions, a gate contact, and a dielectric between the gate contact and the channel region, wherein the source and drain regions are doped regions in a first well; a plurality of drive transistors, wherein each drive transistor comprises a source region, a drain region, a channel region between the source and drain regions, a gate contact, and a dielectric between the gate contact and the channel region, wherein the source and drain regions of each drive transistor are in a well of opposite polarity than the first well; a first direct current (DC) contact to receive DC current, the first DC contact coupled to the gate contacts of the drive transistors and to the gate contact of the sense transistor; a second direct current (DC) contact to receive DC current, the second DC contact coupled to the drain region of the sense transistor; and alternating current (AC) contacts to receive AC current, the AC contacts coupled to the source and drain regions of the drive transistor; a first DC voltage source coupled to the first DC contact; a second DC voltage source coupled to the second DC contact; and an AC voltage source coupled to the AC contacts.

Example 19 includes the subject matter of Example 18, wherein the source and drain regions of the drive transistors are of a different polarity than the first well.

Example 20 includes the subject matter of Example 18, wherein the source and drain regions of the drive transistors are of the same polarity as the first well.

Example 21 includes the subject matter of any one of Examples 18-20, wherein the drive and sense transistors are planar transistors.

Example 22 includes the subject matter of any one of Examples 18-20, wherein the drive and sense transistors are fin-based field-effect transistors (FinFETs).

Example 23 includes the subject matter of any one of Examples 18-22, further comprising a phase locked loop (PLL) circuit, wherein the oscillator is in the PLL circuit.

Example 24 includes the subject matter of any one of Examples 18-22, further comprising radio frequency (RF) transceiver circuitry, wherein the oscillator is in the RF transceiver circuitry.

Example 25 includes an apparatus comprising: a sense transistor comprising a source region, a drain region, a channel region between the source and drain regions, a gate contact, and a dielectric between the gate contact and the channel region, wherein the source and drain regions are doped regions in a first well; a plurality of drive transistors, wherein each drive transistor comprises a source region, a drain region, a channel region between the source and drain regions, a gate contact, and a dielectric between the gate contact and the channel region, wherein the source and drain regions of each drive transistor are in a well of opposite polarity than the first well; a first direct current (DC) contact to receive DC current, the first DC contact coupled to the gate contacts of the drive transistors and to the gate contact of the sense transistor; a second direct current (DC) contact to receive DC current, the second DC contact coupled to the drain region of the sense transistor; and alternating current (AC) contacts to receive AC current, the AC contacts coupled to the source and drain regions of the drive transistor.

Example 26 includes the subject matter of Example 25, further comprising: a first DC voltage source coupled to the first DC contact; a second DC voltage source coupled to the second DC contact; and an AC voltage source coupled to the AC contacts.

Example 27 includes the subject matter of Example 25, wherein the source and drain regions of the drive transistors are of a different polarity than the first well.

Example 28 includes the subject matter of Example 25, wherein the source and drain regions of the drive transistors are of the same polarity as the first well.

Example 29 includes the subject matter of any one of Examples 25-28, wherein the drive and sense transistors are planar transistors.

Example 30 includes the subject matter of any one of Examples 25-28, wherein the drive and sense transistors are fin-based field-effect transistors (FinFETs).

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An apparatus comprising:
   a first transistor comprising a source region, a drain region, a channel region between the source and drain regions, a gate contact, and a dielectric between the gate contact and the channel region, wherein the channel region of the first transistor is in a first well;
   a second transistor comprising a source region, a drain region, a channel region between the source and drain regions, a gate contact, and a dielectric between the gate contact and the channel region, wherein the channel region of the second transistor is in a second well of opposite polarity than the first well;

a third transistor comprising a source region, a drain region, a channel region between the source and drain regions, a gate contact, and a dielectric between the gate contact and the channel region, wherein the channel region is in a third well of the same polarity as the first well;

a first direct current (DC) contact to receive DC current, the first DC contact coupled to the gate contact of the first transistor, to the gate contact of the second transistor, and to the gate contact of the third transistor;

a second direct current (DC) contact to receive DC current, the second DC contact coupled to the drain region of the second transistor; and alternating current (AC) contacts to receive AC current, the AC contacts coupled to the source and drain regions of the first transistor and the third transistor.

2. The apparatus of claim 1, wherein the source and drain regions of the first transistor are of a different polarity than the first well.

3. The apparatus of claim 1, wherein the source and drain regions of the first transistor are of the same polarity as the first well.

4. The apparatus of claim 1, wherein the first and second transistor are planar transistors.

5. The apparatus of claim 1, wherein the first and second transistor are fin-based field-effect transistors (FinFETs).

6. The apparatus of claim 1, wherein the second well is a doped substrate, and the first well is a doped region within the substrate.

7. The apparatus of claim 1, wherein the second transistor is between the first transistor and the third transistors.

8. The apparatus of claim 1, further comprising:
a first DC voltage source coupled to the first DC contact;
a second DC voltage source coupled to the second DC contact; and
an AC voltage source coupled to the AC contacts.

9. A resonator device comprising:
a first transistor comprising a source region, a drain region, a channel region between the source and drain regions, a gate contact, and a dielectric between the gate contact and the channel region, wherein the channel region of the first transistor is in a first well;
a second transistor comprising a source region, a drain region, a channel region between the source and drain regions, a gate contact, and a dielectric between the gate contact and the channel region, wherein the channel region of the second transistor is in a second well of opposite polarity than the first well;
a third transistor comprising a source region, a drain region, a channel region between the source and drain regions, a gate contact, and a dielectric between the gate contact and the channel region, wherein the channel region of the third transistor is in a third well of the same polarity as the first well;
a direct current (DC) source coupled to the gate contact of the first transistor and to the gate contact of the second transistor;
an alternating current (AC) source coupled to the source and drain regions of the first transistor and to the source and drain regions of the third transistor;
sense circuitry coupled to the second transistor to detect modulation of a current flowing through the second transistor based on an input signal from the AC source;
wherein the second transistor is between the first transistor and third transistor.

10. The resonator device of claim 9, wherein the source and drain regions of the first transistor are of a different polarity than the first well.

11. The resonator device of claim 9, wherein the source and drain regions of the first transistor are of the same polarity as the first well.

12. The resonator device of claim 9, wherein the first and second transistor are planar transistors.

13. The resonator device of claim 9, wherein the first and second transistor are fin-based field-effect transistors (FinFETs).

14. The resonator device of claim 9, wherein the second well is a doped substrate, and the first well is a doped region within the substrate.

15. A system comprising:
an oscillator comprising a piezoresistive resonator (PZR) apparatus, the PZR apparatus comprising:
a sense transistor comprising a source region, a drain region, a channel region between the source and drain regions, a gate contact, and a dielectric between the gate contact and the channel region, wherein the source and drain regions are doped regions in a first well;
a plurality of drive transistors, wherein each drive transistor comprises a source region, a drain region, a channel region between the source and drain regions, a gate contact, and a dielectric between the gate contact and the channel region, wherein the source and drain regions of each drive transistor are in a well of opposite polarity than the first well;
a first direct current (DC) contact to receive DC current, the first DC contact coupled to the gate contacts of the drive transistors and to the gate contact of the sense transistor;
a second direct current (DC) contact to receive DC current, the second DC contact coupled to the drain region of the sense transistor; and
alternating current (AC) contacts to receive AC current, the AC contacts coupled to the source and drain regions of the drive transistor;
a first DC voltage source coupled to the first DC contact;
a second DC voltage source coupled to the second DC contact; and
an AC voltage source coupled to the AC contacts.

16. The system of claim 15, wherein the source and drain regions of the drive transistors are of a different polarity than the first well.

17. The system of claim 15, wherein the source and drain regions of the drive transistors are of the same polarity as the first well.

18. The system of claim 15, further comprising a phase locked loop (PLL) circuit, wherein the oscillator is in the PLL circuit.

19. The system of claim 15, further comprising radio frequency (RF) transceiver circuitry, wherein the oscillator is in the RF transceiver circuitry.

20. An apparatus comprising:
a sense transistor comprising a source region, a drain region, a channel region between the source and drain regions, a gate contact, and a dielectric between the gate contact and the channel region, wherein the source and drain regions are doped regions in a first well;
a plurality of drive transistors, wherein each drive transistor comprises a source region, a drain region, a channel region between the source and drain regions, a gate contact, and a dielectric between the gate contact and the channel region, wherein the source and drain regions of each drive transistor are in a well of opposite polarity than the first well;

a first contact coupled to the gate contacts of the drive transistors and to the gate contact of the sense transistor;

a second contact coupled to the drain region of the sense transistor;

a third contact coupled to the source and drain regions of each of the drive transistors.

21. The apparatus of claim 20, further comprising:

a first DC voltage source coupled to the first contact;

a second DC voltage source coupled to the second contact; and a radio frequency (RF) signal source coupled to the third contact.

22. The apparatus of claim 21, wherein the source and drain regions of the first transistor are of a different polarity than the first well.

23. The apparatus of claim 21, wherein the source and drain regions of the first transistor are of the same polarity as the first well.

24. The system of claim 15, wherein the sense transistor is between a first portion of the plurality of drive transistors and a second portion of the plurality of drive transistors.

25. The apparatus of claim 21, wherein the sense transistor is between a first portion of the plurality of drive transistors and a second portion of the plurality of drive transistors.

* * * * *